(12) United States Patent
Yao et al.

(10) Patent No.: US 11,139,745 B2
(45) Date of Patent: Oct. 5, 2021

(54) FLYBACK CONVERTER INPUT VOLTAGE DETECTION

(71) Applicant: DIALOG SEMICONDUCTOR INC., Campbell, CA (US)

(72) Inventors: Jianming Yao, Campbell, CA (US); Mengfei Liu, Campbell, CA (US); Wenduo Liu, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 0 days.

(21) Appl. No.: 16/911,344

(22) Filed: Jun. 24, 2020

(65) Prior Publication Data

US 2020/0412267 A1 Dec. 31, 2020

Related U.S. Application Data

(60) Provisional application No. 62/867,156, filed on Jun. 26, 2019.

(51) Int. Cl.
*H02M 3/335* (2006.01)
*G01R 19/165* (2006.01)
*H02M 1/08* (2006.01)

(52) U.S. Cl.
CPC .. *H02M 3/33592* (2013.01); *G01R 19/16576* (2013.01); *G01R 19/16585* (2013.01); *H02M 1/083* (2013.01)

(58) Field of Classification Search
CPC ......... H02M 3/33576; H02M 3/33592; H02M 1/083; G01R 19/16566; G01R 19/16576; G01R 19/16585
See application file for complete search history.

(56) References Cited

U.S. PATENT DOCUMENTS

| | | | |
|---|---|---|---|
| 9,537,404 B2 | 1/2017 | Li et al. | |
| 9,800,136 B2* | 10/2017 | Eum | H02M 1/32 |
| 10,170,974 B1* | 1/2019 | Oh | H02M 1/4241 |
| 10,333,415 B2* | 6/2019 | Kikuchi | G05F 1/618 |
| 10,951,107 B2* | 3/2021 | Khamesra | H02M 1/08 |
| 2013/0163291 A1 | 6/2013 | Kim et al. | |
| 2018/0191254 A1 | 7/2018 | Feng et al. | |

FOREIGN PATENT DOCUMENTS

| | | |
|---|---|---|
| CN | 102611316 | 7/2012 |
| KR | 10-2001-0063231 | 7/2001 |
| WO | WO 2005/053143 | 6/2005 |

* cited by examiner

*Primary Examiner* — Adolf D Berhane
(74) *Attorney, Agent, or Firm* — Haynes and Boone, LLP

(57) ABSTRACT

A flyback converter is disclosed that times a detection time for each cycle of a power switch transistor. The detection time ends when a sense resistor voltage exceeds a threshold voltage. Over a half cycle of an AC input voltage to the flyback converter measures a series of detection time and determines a minimum detection time from the series of detection times. If the minimum detection time exceeds a brownout delay, a brownout condition exists. If the minimum detection time is less than an overvoltage delay, an overvoltage condition exists.

20 Claims, 3 Drawing Sheets

FLYBACK CONVERTER INPUT VOLTAGE DETECTION

CROSS REFERENCE TO RELATED APPLICATIONS

The present application claims the benefit of U.S. Provisional Application No. 62/867,156, filed Jun. 26, 2019 and entitled "Flyback Converter Input Voltage Detection" the contents of which is incorporated by reference herein.

TECHNICAL FIELD

This application relates to flyback converters, and more particularly to input voltage detection for flyback converters.

BACKGROUND

A flyback converter is typically used to convert unregulated AC input power into a regulated DC voltage such as for charging mobile devices. As part of this power conversion, a diode bridge rectifies the AC voltage from an AC mains into a rectified DC voltage that functions as the input voltage to the flyback converter's primary winding Although the input voltage is rectified and filtered with input DC capacitors, it fluctuates at twice the AC line frequency, particularly in high load conditions. If the AC line voltage drops such as due to a brownout condition, the peak voltage for the input voltage drops. Conversely, the peak voltage for the input voltage rises as the peak amplitude (both positive and negative) for the AC line voltage rises in an overvoltage condition.

To provide proper regulation of its output voltage and for circuit protection, a flyback converter controller will typically monitor the input voltage to detect whether a brownout or overvoltage condition exists. For example, the controller may have a terminal that directly couples to an input voltage rail that carries the input voltage. But the input voltage exceeds 100 V at the peak of its sinusoidal oscillation during normal (no brownout) conditions. A controller with direct input voltage detection must thus employ protection circuitry to provide a high voltage tolerance, which increases costs. In addition, the use of a dedicated terminal for direct input voltage detection also increases costs.

To avoid the costs of direct input voltage detection, flyback controllers with indirect input voltage detection have been developed that use a sense resistor voltage that develops across a sense resistor coupled between the power switch transistor and ground. The sense resistor voltage is thus proportional to the primary winding current that flows through the power switch transistor. In turn, the primary winding current is a function of the input voltage as well as other factors such as the magnetizing inductance of the transformer and the on-time for the power switch transistor. By determining whether the on-time for the power switch exceeds a brownout on-time threshold during the minimums for the sinusoidal variation of the input voltage, a controller may thus detect whether a brownout condition exists. Similarly, the controller may compare the sense resistor voltage to a brownout detection threshold during the minimums for the variation of the input voltage to detect the brownout condition.

Although such indirect detection of the input voltage advantageously eliminates the need for high voltage protection circuitry and a dedicated input voltage detection terminal, the detection accuracy is affected by various process variations such as variations in the magnetizing inductance, the bulk capacitance, load, the sense resistance, and other factors.

Accordingly, there is a need in the art for improved indirect detection of the input voltage for flyback converters.

SUMMARY

In accordance with a first aspect of the disclosure, a flyback converter controller for a flyback converter is provided that includes: a timer configured to time a detection time for each cycle of a power switch transistor, wherein the detection time is the delay between a cycling on of the power switch transistor and when a sense resistor voltage exceeds a threshold detection voltage; a memory configured to store a minimum detection time from each detection time during a half cycle of an AC input voltage; and a logic circuit configured to compare the minimum detection time to a threshold detection time to characterize a rectified input voltage to the flyback converter.

In accordance with a second aspect of the disclosure, a method of determining whether a brownout condition exists for a flyback converter is provided that includes: during a half-cycle of an AC input voltage for powering the flyback converter, cycling a power switch transistor through a series of on-times; for each on-time, timing a detection time from a beginning of the on-time to when a sense resistor voltage exceeds a threshold detection voltage to form a series of detection times corresponding to the series of on-times; determining a minimum detection time in the series of on-times; and determining whether the minimum detection time exceeds a brownout detection time to detect whether the brownout condition exists.

In accordance with a third aspect of the disclosure, a flyback converter controller for a flyback converter is provided that includes: a timer configured to time a detection time for each cycle of a power switch transistor, wherein the detection time is a delay between when a sense resistor voltage exceeds a first threshold voltage and when the sense resistor voltage exceeds a threshold detection voltage, the timer being further configured to detect a series of the detection times during a half cycle of an AC input voltage; a memory configured to store a minimum detection time from each detection time during a half cycle of an AC input voltage; and a logic circuit configured to compare the minimum detection time to a threshold detection time to characterize a rectified input voltage to the flyback converter.

These advantageous features may be better appreciated through a consideration of the detailed description below.

DETAILED DESCRIPTION

Figure 1:
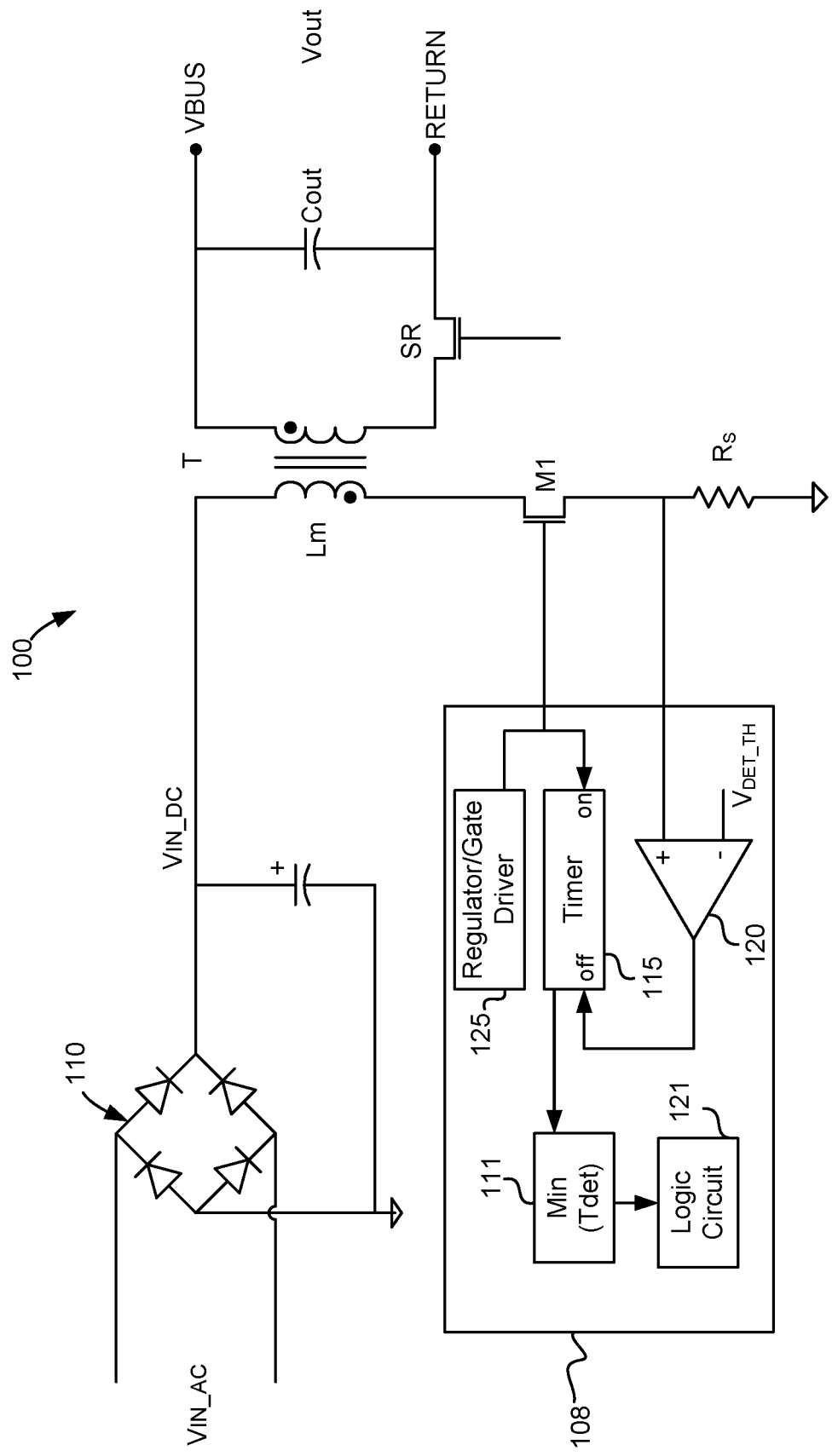
FIG. 1 illustrates an example flyback converter in which a controller times a detection time starting from when a power switch transistor is switched and ending when a sense resistor voltage exceeds a threshold detection voltage to indirectly detect the AC input voltage in accordance with an aspect of the disclosure.

Embodiments of the present disclosure and their advantages are best understood by referring to the detailed description that follows. It should be appreciated that like reference numerals are used to identify like elements illustrated in one or more of the figures.

To provide improved accuracy for the indirect detection of the rectified input voltage to a flyback converter, a flyback converter controller is disclosed that compares the sense resistor voltage to a threshold at the peaks for the rectified sinusoidal variation of the rectified input voltage. The advantages of such an indirect detection of the rectified input voltage may be better appreciated through a consideration of the following theoretical factors. For example, the rectified input voltage ($V_{IN\_DC}$) may be expressed as follows:

$$V_{IN\_DC} = \frac{L_m}{R_s} \frac{V_{DET\_TH}}{t_{DET}}$$

where $L_m$ is the magnetizing inductance, $R_S$ is the sense resistor voltage, $V_{DET\_TH}$ is a threshold detection voltage for the sense resistor voltage, and $t_{DET}$ is the delay between the switching on of the power switch transistor and sense resistor voltage satisfying the threshold detection voltage $V_{DET\_TH}$. Note that the detection of the maximum value for the rectified input voltage ($V_{IN\_DC(max)}$) is only affected by $L_m$ and $R_S$ and is not affected by the bulk capacitance or the load variations. In addition, $V_{IN\_DC(max)}$ is directly proportional to the root-mean-square (RMS) value for the AC input voltage ($V_{IN\_AC(RMS)}$) as given by the following expression:

$$V_{IN\_DC(max)} = \sqrt{2} V_{IN\_AC(RMS)}$$

In turn, the RMS AC input voltage may be expressed as:

$$V_{IN\_AC(RMS)} = \frac{\sqrt{2}}{2} \frac{L_m}{R_s} \frac{V_{DET\_TH}}{t_{DET(min)}}$$

The detection time $t_{DET}$ will vary according to the rectified sinusoidal variation of the rectified input voltage. As the rectified input voltage rises, the detection time decreases. Conversely, as the rectified input voltage falls, the detection time rises. The detection time will thus cyclically fall and rise as the rectified input voltage rises and falls.

The AC input voltage has a zero crossing at the end of each half-cycle of the AC input voltage. The rectified input voltage falls to a minimum value at zero crossings of the AC input voltage. As the AC input voltage rises to its positive and negative maximum values, the rectified input voltage rises to its peak. Each half-cycle of the AC input voltage extends from a zero crossing to a subsequent zero crossing. For each half-cycle of the AC input voltage, the rectified input voltage will thus rise from a minimum value to its peak value and then fall again to the minimum value. It thus follows that for each half-cycle of the AC input voltage, the detection time will fall from a maximum value to a minimum value and then rise back up again to the maximum value. The flyback controllers disclosed herein detect the minimum value for the detection time in each half-cycle of the AC input voltage and use this minimum to detect the peak rectified input voltage for each half-cycle of the AC input voltage. From this measurement of the peak rectified input voltage, the flyback controller may then proceed to detect overvoltage or brownout conditions.

An example flyback converter 100 including a controller 105 is shown in FIG. 1. A diode bridge 110 rectifies an AC line voltage ($V_{IN\_AC}$) for an AC mains to rectify a rectified input voltage $V_{IN\_DC}$ for flyback converter 100. Controller 105 includes a modulator 125 that modulates the cycling of a power switch transistor M1 to regulate an output voltage Vout for flyback converter 100. During each cycle, modulator 125 is integrated with a switch driver that switches on power switch transistor M1 so that a primary winding current for a transformer T flows through power switch transistor M1 and develops a sense resistor voltage across a sense resistor $R_S$. While the primary current flows, a synchronous rectifier (SR) switch transistor is maintained off to keep a secondary winding current from conducting. When regulator 125 shuts off power switch transistor M1, the SR switch transistor is cycled on so that the stored magnetic energy in transformer T drives the secondary winding current to charge an output capacitor Cout with the output voltage. Alternatively, the secondary winding current may be rectified with an output diode in lieu of using synchronous rectification.

As noted earlier, the slew rate of the primary winding current is proportional to the RMS value for the AC input voltage. As the RMS value increases, the on-time duration for the power switch transistor M1 decreases to reach a given amount of primary winding current. Controller 105 may thus use a timer 115 to time a detection time that begins when the switch driver 125 switches on power switch transistor M1 and that ends when an output signal from a comparator 120 indicates that the sense resistor voltage has increased to equal or be greater than a threshold detection voltage $V_{DET\_TH}$. As discussed earlier, the detection time will have a minimum duration in each half-cycle of the AC input voltage. During each half-cycle, a memory 111 such as a register stores the detection time from each on-time of the power switch transistor M1. In general, there are multiple on-times of power switch transistor M1 in each half-cycle. At the beginning of a half-cycle, the detection time for each on-time of power switch transistor M1 is relatively large but will successively become smaller as the rectified input voltage increases towards its peak value. The detection time for a current on-time of the power switch transistor M1 may be denoted as a current detection time whereas the detection time from a preceding on-time of the power switch transistor M1 may be denoted as a previous detection time. Memory 111 replaces its stored previous detection time with the currently-calculated detection time if the currently-calculated detection time is less than the previous detection time.

Figure 2:
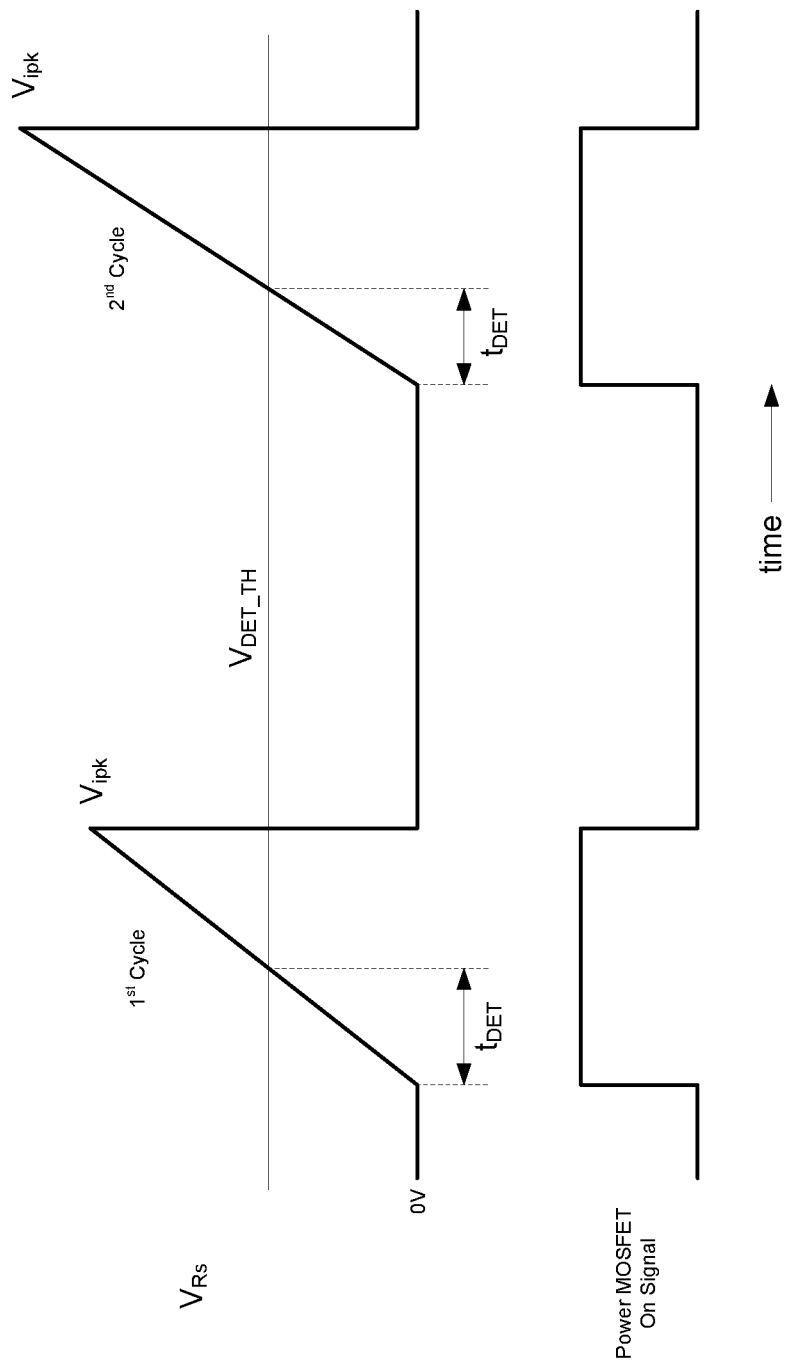
FIG. 2 illustrates some waveforms for the controller of FIG. 1.

The sense resistor voltage and power switch cycling waveforms for flyback converter 100 are shown in FIG. 2. In a first on-time for power switch transistor M1, the RMS AC input voltage is lower as compared to a second on-time for power switch transistor M1. In the first on-time, the detection time $t_{DET}$ for the sense resistor voltage ($V_{RS}$) is thus longer as compared to the detection time for the second on-time.

As the AC input voltage cycles to a peak in each AC half-cycle, the detection time will thus cycle to a corresponding low. Referring again to FIG. 1, a logic circuit 121 in controller 105 may thus compare the minimum detection time as determined by timer 115 and stored in memory 111 to a threshold time for each AC half-cycle to characterize the AC input voltage. For example, in a brownout condition, the minimum detection time for each AC half-cycle will lengthen. Logic circuit 121 may thus determine whether the minimum detection time exceeds a brownout threshold time to determine whether a brownout condition exists. Conversely, the minimum detection time will be less than an overvoltage threshold time during an overvoltage condition for the AC input voltage. Logic circuit 121 may thus determine whether the minimum detection time is less than an overvoltage threshold time for each AC half-cycle to determine whether an overvoltage condition exists. In response to detecting the overvoltage condition, logic circuit 121 may command regulator 125 to cease the cycling of power switch transistor M1 to prevent damage to flyback converter 100 from the overvoltage condition.

The AC line voltage detection technique disclosed herein is not limited to the detection of brownout and overvoltage conditions. For example, note that a flyback converter may need to be compatible with the electrical standards of various regions such as whether the RMS AC voltage is 110 volts (low line) or 220 volts (high line). To determine whether flyback converter 100 is powered by a low line or high line AC mains for PWM control optimization, controller 105 may thus determine whether the minimum detection time for each AC half-cycle exceeds a high line threshold time. If the minimum detection time exceeds the high line threshold time, controller 105 determines the existence of the low line condition. Conversely, if the minimum detection time is less than the high line threshold time, controller 105 determines the existence of the high line condition. The brownout detection time is greater than the high line threshold time, which in turn is greater than the overvoltage detection time.

Figure 3:
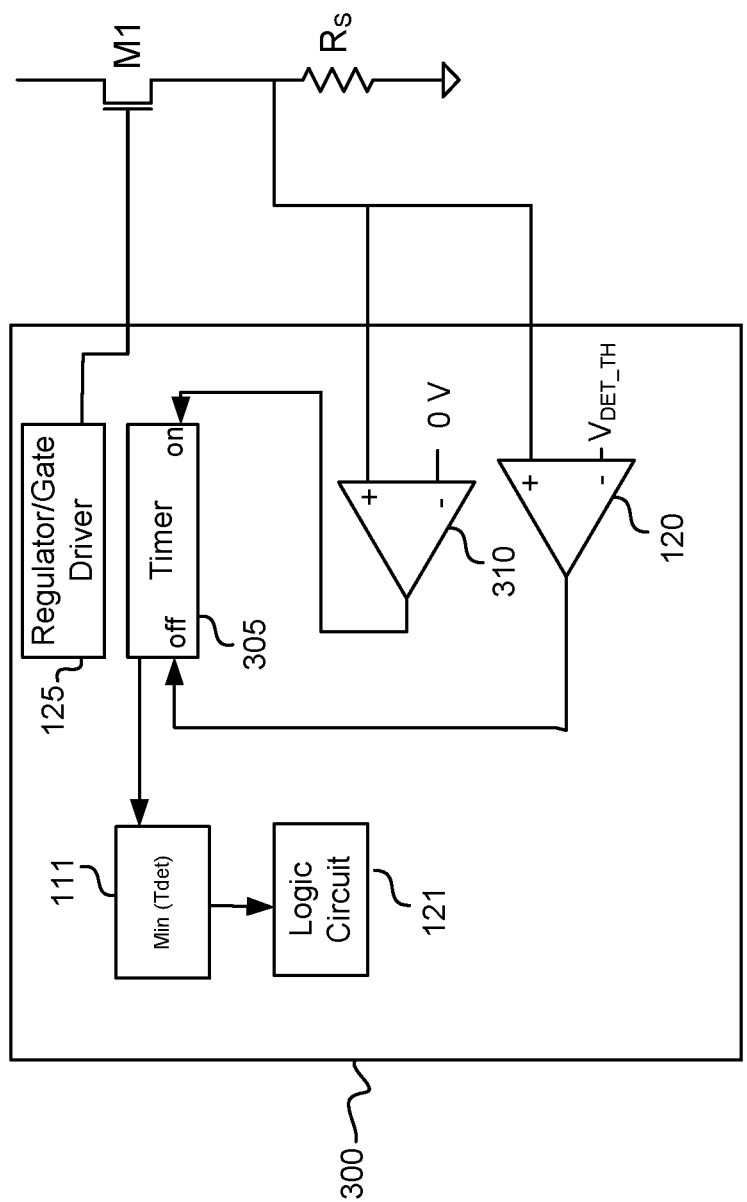
FIG. 3 illustrates a controller that times a detection time starting from when the sense resistor voltage crosses a first threshold voltage (e.g., a zero volt threshold) and ending when the sense resistor voltage exceeds a threshold detection voltage to indirectly detect the AC input voltage in accordance with an aspect of the disclosure.

If the flyback converter operates at continuous conduction mode (CCM) or zero-voltage-switching condition (ZVS), the initial current through the main power switch or the initial voltage of the current sensing resistor is not zero. For CCM operation, the initial current is positive, and it is negative for ZVS operation. In such cases, the detection time should not start from the main power switch turn-on point. Instead, the detection time should be modified to be the time interval between the two voltage thresholds for current sensing resistor voltage, and the $V_{DET\_TH}$ should be replaced by the voltage difference between the two voltage thresholds. An example controller 300 for ZVS operation is shown in FIG. 3. A comparator 300 detects when the sense resistor voltage crosses a first threshold voltage such as 0 volts. Comparator 300 then asserts its output signal to trigger a timer 305 to begin timing a detection time. Comparator 120 functions as discussed previously to cause timer 305 to stop timing the detection time in response to the sense resistor voltage rising above the threshold detection voltage $V_{DET\_TH}$. Memory 111 functions as discussed for controller 100 to store the minimum detection time for each AC half-cycle. Logic circuit 121 may then compare the minimum detection time to the brownout, overvoltage, and high line threshold times to detect these conditions analogously as discussed for controller 100.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A flyback converter controller for a flyback converter, comprising:
    a timer configured to time a detection time for each cycle of a power switch transistor, wherein the detection time is a delay between a cycling on of the power switch transistor and when a sense resistor voltage exceeds a threshold detection voltage, the timer being further configured to detect a series of the detection times during a half cycle of an AC input voltage;
    a memory configured to store a minimum detection time from the series of the detection times; and
    a logic circuit configured to compare the minimum detection time to a threshold detection time to characterize a rectified input voltage to the flyback converter.

2. The flyback converter controller of claim 1, further comprising:
    a regulator configured to modulate a cycling of the power switch transistor to regulate an output voltage; and
    a comparator configured to compare the sense resistor voltage to the threshold detection voltage, wherein the timer is configured to stop timing each detection time responsive to an assertion of a comparator output signal from the comparator.

3. The flyback converter controller of claim 2, further comprising:
    a switch driver for driving the power switch transistor, wherein the timer is configured to being timing the detection time responsive to an assertion of an output signal from the switch driver.

4. The flyback converter controller of claim 2, wherein the logic circuit is configured to determine whether the minimum detection time exceeds a brownout detection time to determine whether a brownout condition exists.

5. The flyback converter controller of claim 3, wherein the logic circuit is configured to determine whether the minimum detection time is less than an overvoltage detection time to determine whether an overvoltage condition exists.

6. The flyback converter controller of claim 5, wherein the logic circuit is further configured to command the switch driver to stop driving the power switch transistor responsive to a detection of the overvoltage condition.

7. The flyback converter controller of claim 2, wherein the controller is configured to determine whether the minimum detection time is less than a high line detection time to determine whether an AC mains powering the flyback converter is a 110 V AC mains or a 220 V AC mains.

8. A method of determining whether a brownout condition exists for a flyback converter, comprising:
    during a half-cycle of an AC input voltage for powering the flyback converter, cycling a power switch transistor through a series of on-times;
    for each on-time, timing a detection time from a beginning of the on-time to when a sense resistor voltage exceeds a threshold detection voltage to form a series of detection times corresponding to the series of on-times;
    determining a minimum detection time in the series of on-times; and
    determining whether the minimum detection time exceeds a brownout detection time to detect whether the brownout condition exists.

9. The method of claim 8, further comprising:
    determining whether the minimum detection time is less than an overvoltage detection time to detect whether an overvoltage condition exists.

10. The method of claim 9, further comprising: ceasing the cycling of the power switch transistor responsive to a detection of the overvoltage condition.

11. The method of claim 8, further comprising:
determining whether the minimum detection time is less than a high line detection time to detect whether an AC mains for powering the flyback converter is a 110 V AC mains or a 220 V AC mains.

12. The method of claim 9, wherein the overvoltage detection time is less than the brownout detection time.

13. The method of claim 8, further comprising measuring a peak rectified input voltage to the flyback converter from the minimum detection time.

14. A flyback converter controller for a flyback converter, comprising:
a timer configured to time a detection time for each cycle of a power switch transistor, wherein the detection time is a delay between when a sense resistor voltage exceeds a first threshold voltage and when the sense resistor voltage exceeds a threshold detection voltage, the timer being further configured to detect a series of the detection times during a half cycle of an AC input voltage;
a memory configured to store a minimum detection time from the series of the detection times during the half cycle of an AC input voltage; and
a logic circuit configured to compare the minimum detection time to a threshold detection time to characterize a rectified input voltage to the flyback converter.

15. The flyback converter controller of claim 14, further comprising:
a first comparator configured to assert a first output signal responsive to the sense resistor voltage being larger than the first threshold voltage, wherein the timer is configured to begin timing each detection time responsive to the assertion of the first output signal.

16. The flyback converter controller of claim 15, further comprising:
a second comparator configured to assert a second output signal responsive to the sense resistor voltage being larger than the threshold detection voltage, wherein the timer is configured to finish timing each detection time responsive to the assertion of the second output signal.

17. The flyback converter controller of claim 15, wherein the first threshold voltage is approximately zero volts.

18. The flyback converter controller of claim 17, wherein the flyback converter is a zero-voltage switching flyback converter.

19. The flyback converter controller of claim 14, wherein the logic circuit is configured to determine whether the minimum detection time exceeds a brownout detection time to determine whether a brownout condition exists.

20. The flyback converter controller of claim 14, wherein the logic circuit is configured to determine whether the minimum detection time is less than an overvoltage detection time to determine whether an overvoltage condition exists.

* * * * *